United States Patent
Sato et al.

(10) Patent No.: US 8,605,494 B2
(45) Date of Patent: Dec. 10, 2013

(54) MEMORY DEVICE AND WRITING METHOD THEREOF

(75) Inventors: Koji Sato, Tokyo (JP); Kiyoshi Nakai, Tokyo (JP); Kenji Mae, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 677 days.

(21) Appl. No.: 12/591,295

(22) Filed: Nov. 16, 2009

(65) Prior Publication Data

US 2010/0124104 A1    May 20, 2010

(30) Foreign Application Priority Data

Nov. 20, 2008   (JP) .................... 2008-296848

(51) Int. Cl.
  *G11C 11/00*   (2006.01)
(52) U.S. Cl.
  USPC ....................... 365/163; 365/189.16
(58) Field of Classification Search
  USPC ................. 365/163, 189.16, 189.11
  See application file for complete search history.

(56) References Cited

U.S. PATENT DOCUMENTS

| 5,757,700 A * | 5/1998 | Kobayashi | 365/189.16 |
| 6,813,177 B2 * | 11/2004 | Lowrey et al. | 365/148 |
| 7,460,389 B2 * | 12/2008 | Hsu et al. | 365/113 |
| 2004/0228163 A1 * | 11/2004 | Khouri et al. | 365/154 |
| 2005/0141261 A1 * | 6/2005 | Ahn | 365/148 |
| 2006/0203541 A1 * | 9/2006 | Toda | 365/163 |
| 2007/0064473 A1 | 3/2007 | Lee et al. | |
| 2009/0003049 A1 * | 1/2009 | Lee et al. | 365/163 |
| 2009/0073753 A1 * | 3/2009 | Osada et al. | 365/163 |

FOREIGN PATENT DOCUMENTS

JP    2007-87568    4/2007

\* cited by examiner

*Primary Examiner* — Douglas King
(74) *Attorney, Agent, or Firm* — McGinn IP Law Group, PLLC

(57) ABSTRACT

A write amplifier for driving a bit line connected to a selected phase change memory cell drives the bit line with a first current driving capability and then drives the bit line with a second current driving capability lower than the first current driving capability.

13 Claims, 5 Drawing Sheets

MEMORY DEVICE AND WRITING METHOD THEREOF

This application is based on and claims priority from Japanese Patent Application No. 2008-296848 filed on Nov. 20, 2008. The disclosure thereof is incorporated herein by reference in its entirety.

BACKGROUND OF THE INVENTION

1. Field of the Invention

This invention relates to a memory device and a writing method thereof.

2. Description of the Related Art

The phase state of a phase change material such as chalcogenide can be changed between a crystalline state and an amorphous state by heating and cooling and the phase change material exhibits a different resistance value depending on its phase state. A memory device configured to store information using such a phase change material (variable resistance element) is called a phase change memory device.

In the phase change memory device, the phase state of the variable resistance element is changed by controlling the magnitude and duration of current supplied to the variable resistance element to heat and cool it. Information can be stored as a phase state of the variable resistance element and can be read as a resistance value thereof.

A related phase change memory device comprises a memory cell array having a plurality of memory cells arranged in rows and columns and each using a phase change material as a variable resistance element, and a write driver connected to the memory cell array through a bit line selection circuit. Such a phase change memory device is described in, for example, Japanese Unexamined Patent Application Publication (JP-A) No. 2007-87568 (Patent Document 1).

SUMMARY

The technique described in Patent Document 1 achieves a reduction in program time (i.e. speed-up) by reducing the setup time of a pump circuit serving to enhance the current supply capability of the write driver.

Following the speed-up of a computer system, however, a phase change memory device for use therein is required to be further speeded up. The present inventors have discovered that when driving a bit line, it takes time to raise the voltage of the bit line to a predetermined value due to a relatively large capacitance of the bit line, thus resulting in a long write time.

In one embodiment, there is provided a semiconductor device which includes a write amplifier adapted to drive a bit line, connected to a selected phase change memory cell, with a first current driving capability and then to drive the bit line to a write voltage, corresponding to data to be written, with a second current driving capability lower than the first current driving capability.

According to this invention, by providing a write amplifier adapted to drive a bit line, connected to a selected phase change memory cell, with a first current driving capability and then to drive the bit line to a write voltage, corresponding to data to be written, with a second current driving capability lower than the first current driving capability, it is possible to quickly drive the bit line to the required voltage and thus to shorten the write time for the selected memory cell.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
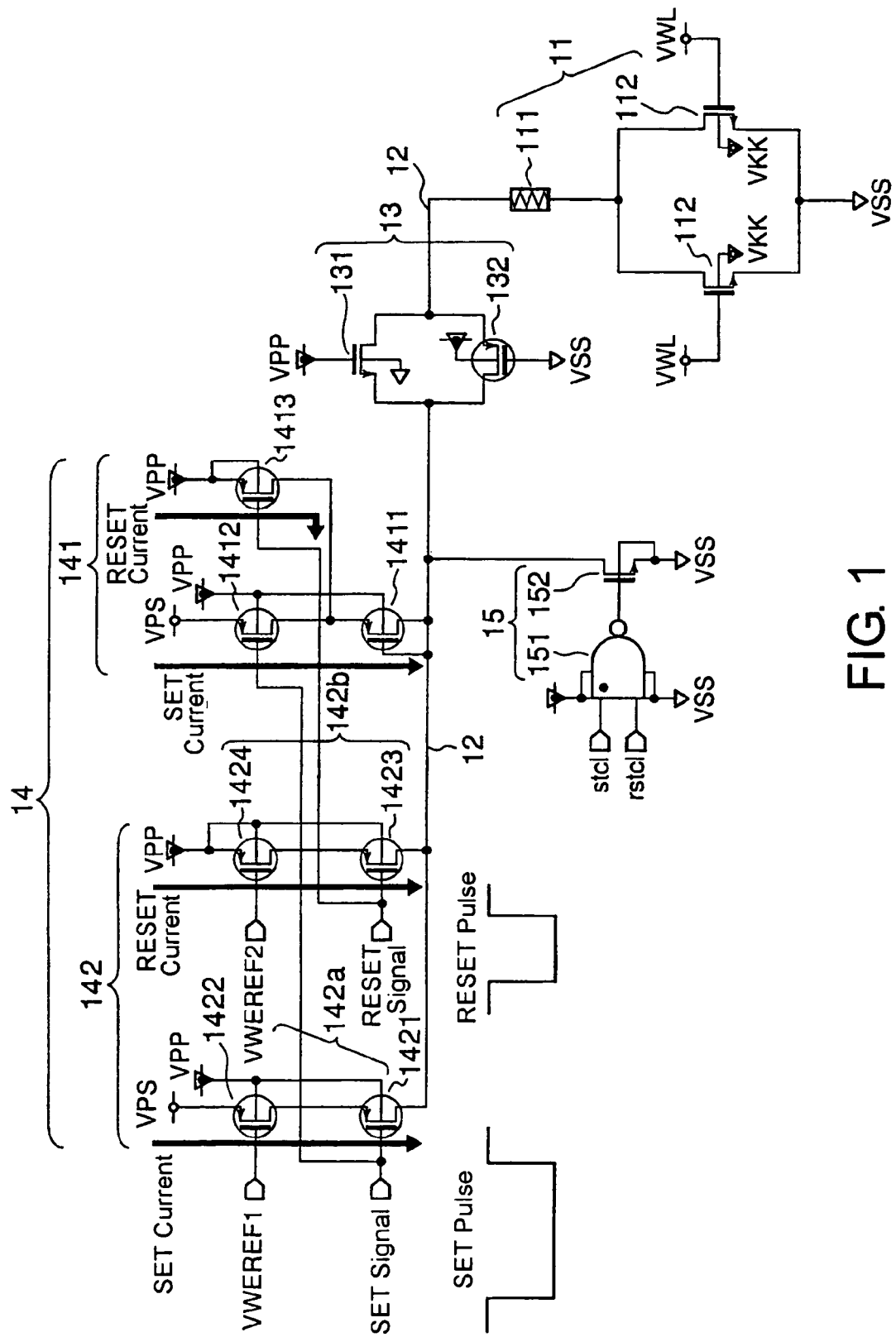
FIG. 1 is a circuit diagram showing a main portion of a phase change memory device according to a first embodiment of this invention.

FIG. 1 is a circuit diagram showing a main portion of a phase change memory device (or a semiconductor device) according to a first embodiment of this invention. FIG. 1 only illustrates a single memory cell 11 and a portion relating to a write operation for this memory cell 11. Actually, the phase change memory device includes a plurality of memory cells arranged in rows and columns. Hereinafter, it is assumed that the memory cell 11 is a selected memory cell in which data are written.

The phase change memory device of FIG. 1 comprises a cell array (not illustrated) including the memory cell 11, Yj switches (bit line selection switches) 13 for hierarchizing bit lines 12 of the cell array, respectively, write amplifiers (write drivers) 14 for driving the bit lines 12 selected by the Yj switches 13, respectively, and voltage drop circuits 15 each for dropping the voltage of the corresponding bit line 12 to a low-potential side power supply VSS level. In this specification, a "bit line" includes not only a line connecting between the memory cell 11 and the Yj switch 13, but also a line connecting between the Yj switch 13 and the write amplifier 14.

The memory cell 11 comprises a variable resistance element 111 made of, for example, GST (GeSbTe: germanium.antimony.tellurium) and cell transistors (herein a pair of NMOSs (n-channel MOS transistors), which, however, may be a single NMOS if it has a predetermined current performance) 112.

The Yj switch 13 comprises a pair of an NMOS 131 and a PMOS (p-channel MOS transistor) 132 both connected to the bit line 12.

The write amplifier 14 comprises a first write amplifier section 141 and a second write amplifier section 142 adapted to jointly provide a first current driving capability. The second write amplifier section 142 provides a second current driving capability lower than the first current driving capability in a state where the first write amplifier section 141 stops driving the bit line 12. The first write amplifier section 141 serves as a write amplifier for high-speed bit line activation.

The first write amplifier section 141 comprises a PMOS 1411 with its drain and gate commonly connected to the bit line 12, a PMOS 1412 connected between the PMOS 1411 and a high-potential side power supply VPS, and a PMOS 1413 connected between the PMOS 1411 and a high-potential side (boost) power supply VPP. The PMOSs 1412 and 1413 each correspond to a first switch and the PMOS 1411 corresponds to a first current trimming portion.

A SET signal (SET pulse) and a RESET signal (RESET pulse) are input to the gates of the PMOSs 1412 and 1413, respectively. The SET signal is an input signal for changing the variable resistance element 111 into a crystalline state (set state), i.e. a SET write signal, and the RESET signal is an input signal for changing the variable resistance element 111 into an amorphous state (reset state), i.e. a RESET write signal. The PMOSs 1412 and 1413 are turned on when the SET signal and the RESET signal are at an inactive level, respectively, and are turned off when the SET signal and the RESET signal are at an active level, respectively. It never happens that the SET signal and the RESET signal are simultaneously set to the inactive level. The pulse width of the SET signal is set to be greater than that of the RESET signal. The PMOS 1411 supplies current to the bit line 12 when either one of the PMOSs 1412 and 1413 is on and further the voltage of the bit line 12 is relatively low.

As will be described later, while the first write amplifier section 141 supplies the current to the bit line 12, the second write amplifier section 142 constantly supplies current to the bit line 12 so that the bit line 12 is driven with the first current driving capability higher than the second current driving capability possessed by the second write amplifier section 142. When the current supply from the first write amplifier section 141 is stopped, the bit line 12 is driven only by the second write amplifier section 142 with its second current driving capability lower than the first current driving capability.

The second write amplifier section 142 comprises a SET write amplifier section 142a and a RESET write amplifier section 142b. The SET write amplifier section 142a and the RESET write amplifier section 142b may have different current driving capabilities. However, since these amplifier sections 142a and 142b do not simultaneously drive the bit line 12 (the SET signal and the RESET signal are not simultaneously set to the inactive level), it is expressed in this specification that each of them has the second current driving capability.

The SET write amplifier section 142a comprises a switching PMOS 1421 and a current trimming PMOS 1422 connected in series between the bit line 12 and the high-potential side power supply VPS. Likewise, the RESET write amplifier section 142b comprises a switching PMOS 1423 and a current trimming PMOS 1424 connected in series between the bit line 12 and the high-potential side (boost) power supply VPP. The switching PMOSs 1421 and 1423 each correspond to a second switch and the current trimming PMOSs 1422 and 1424 each correspond to a second current trimming portion.

The SET signal and the RESET signal are input to the gates of the switching PMOSs 1421 and 1423, respectively. Like the PMOSs 1412 and 1413, the PMOSs 1421 and 1423 are turned on when the SET signal and the RESET signal are at the inactive level, respectively, and are turned off when the SET signal and the RESET signal are at the active level, respectively.

Constant voltages VWEREF1 and VWEREF2 are input to the gates of the current trimming PMOSs 1422 and 1424, respectively. The constant voltages VWEREF1 and VWEREF2 are determined so that the appropriate (i.e. the second) current driving capabilities are obtained for SET writing and RESET writing, respectively. For example, the current driving capability is set to be smaller for SET writing than for RESET writing.

The voltage drop circuit 15 comprises a coincidence circuit 151 and an NMOS 152.

Figure 2:
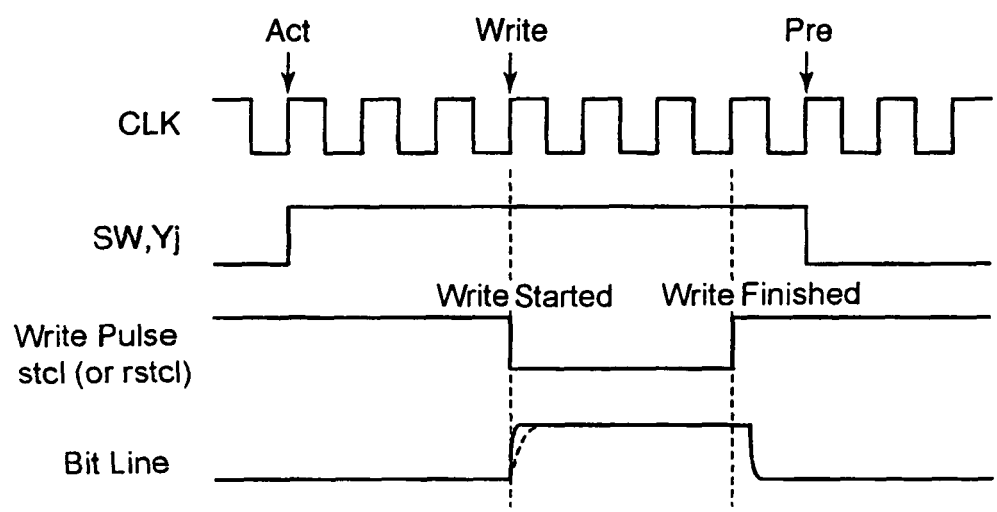
FIG. 2 is a time chart for explaining the operation of the phase change memory device of FIG. 1.

Referring now also to a waveform diagram of FIG. 2, the write operation of the phase change memory device of FIG. 1 will be described.

When a word line drive signal (SW) and a Yj selection signal (Yj) are changed to an active level at timing Act, the cell transistors 112 and the Yj switch 13 are both turned on. In the initial state, the NMOS 152 of the voltage drop circuit 15 is on so that the bit line 12 is at the same potential as the low-potential side power supply VSS (=0V).

Then, when a Write pulse (SET signal stcl or RESET signal rstcl) is changed to an inactive level at timing Write, the write amplifier 14 starts supplying write current and, simultaneously, the NMOS 152 of the voltage drop circuit 15 is turned off. Thus, the voltage of the bit line 12 rises to a predetermined value.

Thereafter, when the Write pulse (stcl or rstcl) is changed to an active level, the write amplifier 14 stops supplying the current to the bit line 12 and, simultaneously, the NMOS 152 of the voltage drop circuit 15 is turned on. Thus, the voltage of the bit line 12 becomes equal to the low-potential side power supply voltage (=0V).

In the manner described above, the write current is supplied to the variable resistance element 111 for a time corresponding to the pulse width of the Write pulse (i.e. the SET signal stcl or the RESET signal rstcl). The variable resistance element 111 is heated according to the magnitude of the supplied current and then cooled (heat dissipation) so that the phase state thereof is determined.

Now, the operation of the write amplifier 14 will be described in further detail.

In the SET write amplifier section 142a (or the RESET write amplifier section 142b) of the second write amplifier section 142, when the SET signal stcl (or the RESET signal rstcl) is changed to the inactive level, the PMOS 1421 (or 1423) is turned on in response thereto. Thus, the second write amplifier section 142 drives the bit line 12 with the second current driving capability determined by VWEREF1 (or VWEREF2).

On the other hand, in the first write amplifier section 141, when the SET signal stcl (or the RESET signal rstcl) is changed to the inactive level, the PMOS 1412 (or 1413) is turned on in response thereto. In this event, since the voltage of the bit line 12 is relative low (0V in the initial state), the PMOS 1411 allows current from the PMOS 1412 (or 1413) toward the bit line 12 to pass therethrough. That is, the first write amplifier section 141 drives the bit line 12 jointly with the second write amplifier section 142. As a result, the bit line 12 is driven with the first current driving capability higher than the second current driving capability possessed by the second write amplifier section 142. Thus, the rise of the voltage of the bit line 12 becomes steep to make it possible to shorten the write time for the memory cell 11.

Thereafter, when the voltage of the bit line 12 reaches VPS-Vth (a voltage lower than VPS by Vth) (or VPP-Vth, i.e., a voltage lower than VPP by Vth), almost no current flows through the PMOS 1411. That is, the current supply to the bit line 12 from the first write amplifier section 141 is stopped. On the other hand, the current supply to the bit line 12 (i.e. the memory cell 11) from the second write amplifier section 142 is continued. This prevents an increase in power consumption and a write error due to supplying an amount of current more than necessary.

The driving of the bit line 12 with the second current driving capability using the second write amplifier section 142 is carried out until the voltage of the bit line 12 reaches a voltage (≈VPS or VPP) corresponding to data to be written, and is further continued thereafter. After the voltage of the bit line 12 reaches the voltage corresponding to the data to be written, a constant current is supplied to the memory cell 11 through the bit line 12.

Figure 3:
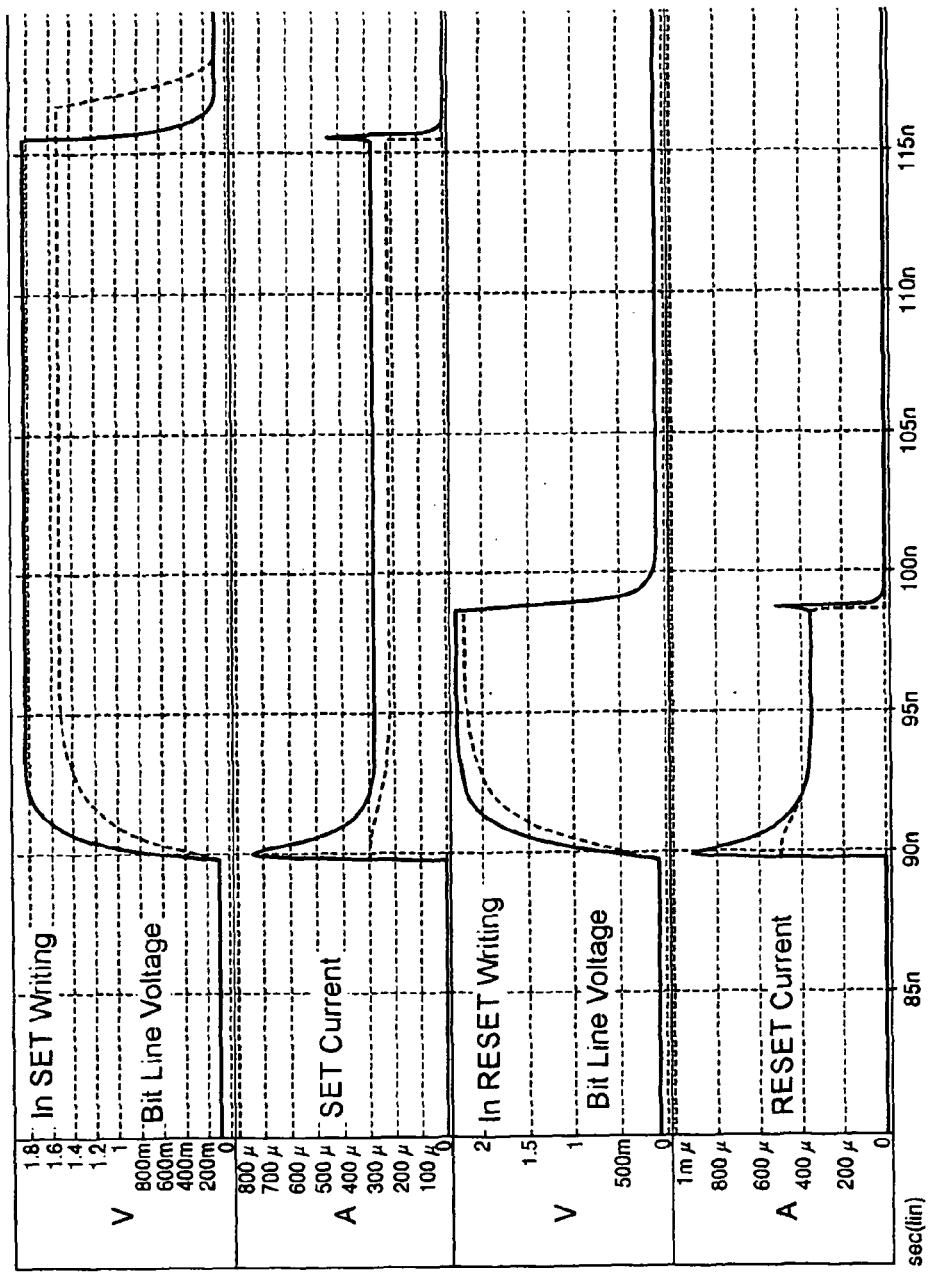
FIG. 3 is a waveform diagram showing time-dependent changes in voltage and current at the time of driving a bit line in the phase change memory device of FIG. 1.

FIG. 3 shows, in solid lines, changes in bit line voltage and current at the time of SET writing and RESET writing in the phase change memory device according to this embodiment and further shows, in broken lines, those in the related phase change memory device. As clear from FIG. 3, in the phase change memory device according to this embodiment, the voltage rise at the time of driving the bit line 12 is steep.

As described above, according to this embodiment, it is possible to shorten the write time for the memory cell 11 by, when driving the bit line 12, starting to drive the bit line 12 with the first current driving capability higher than the second current driving capability necessary for SET writing or RESET writing, then driving the bit line 12 with the second current driving capability lower than the first current driving capability.

Figure 4:
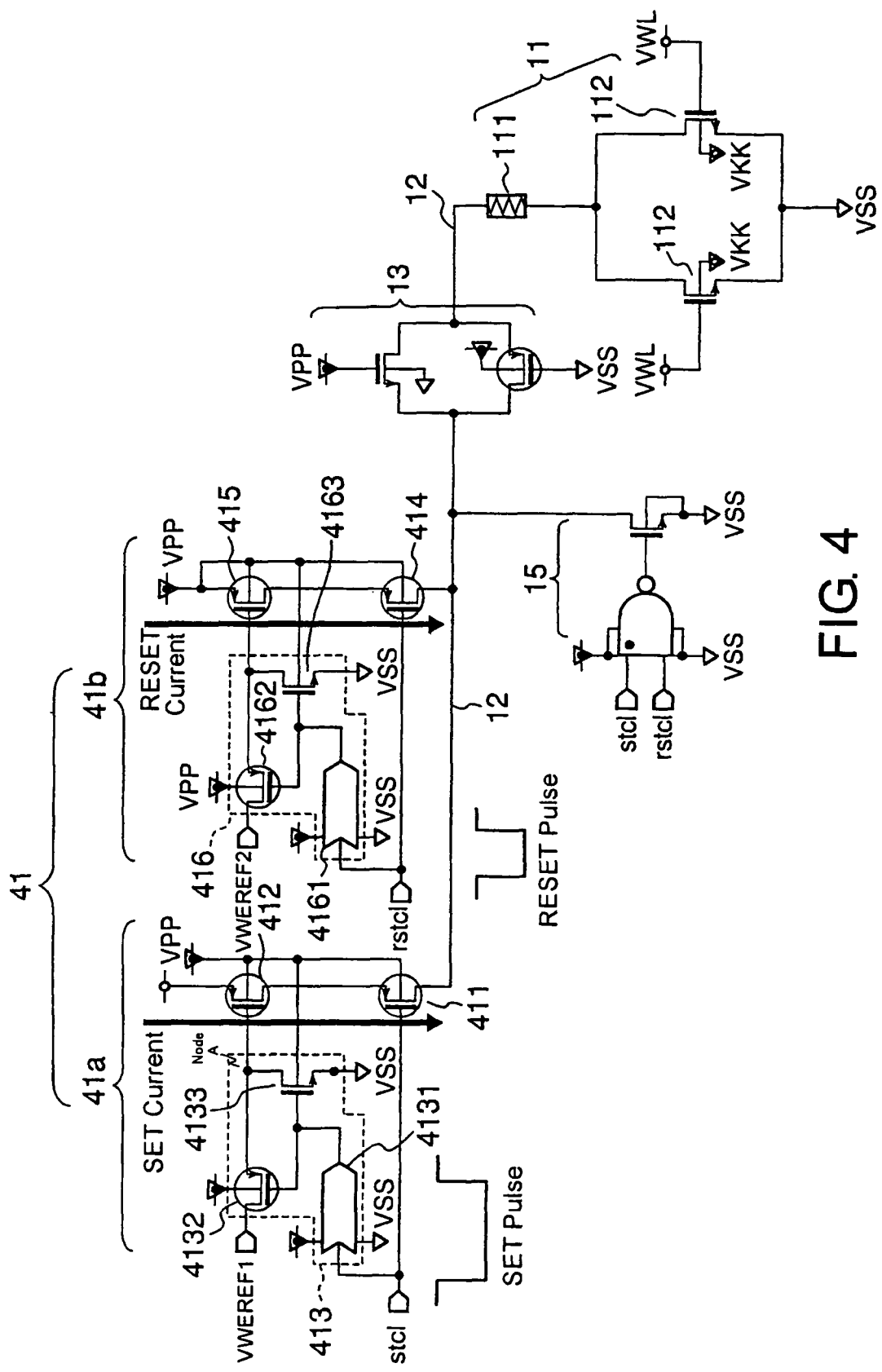
FIG. 4 is a circuit diagram showing a main portion of a phase change memory device according to a second embodiment of this invention.

Referring now to FIG. 4, a phase change memory device (or a semiconductor device) according to a second embodiment of this invention will be described.

The phase change memory device of FIG. 4 differs from that of FIG. 1 in that a write amplifier 41 is used instead of the write amplifier 14.

The write amplifier 41 comprises a SET write amplifier section 41a and a RESET write amplifier section 41b.

The SET write amplifier section 41a has a switching PMOS 411 and a current trimming PMOS 412 connected in series between a bit line 12 and a high-potential side power supply VPS. Further, the SET write amplifier section 41a has a control voltage changing section 413 for controlling the control voltage of the current trimming PMOS 412. The control voltage changing section 413 comprises a delay circuit 4131, and a PMOS 4132 and an NMOS 4133 each adapted to be turned on or off according to an output from the delay circuit 4131.

A SET signal stcl is input, as an input signal, to the gate of the switching PMOS 411 and is also input to the delay circuit 4131. Further, a constant voltage VWEREF1 is input to the drain of the PMOS 4132.

The RESET write amplifier section 41b is configured in the same manner as the SET write amplifier section 41a. That is, the RESET write amplifier section 41b comprises a switching PMOS 414 and a current trimming PMOS 415 connected in series between the bit line 12 and a high-potential side (boost) power supply VPP, and a control voltage changing section 416. The control voltage changing section 416 comprises a delay circuit 4161, a PMOS 4162, and an NMOS 4163.

A RESET signal rstcl is input, as an input signal, to the gate of the PMOS 414 and is also input to the delay circuit 4161. Further, a constant voltage VWEREF2 is input to the drain of the PMOS 4162.

Figure 5:
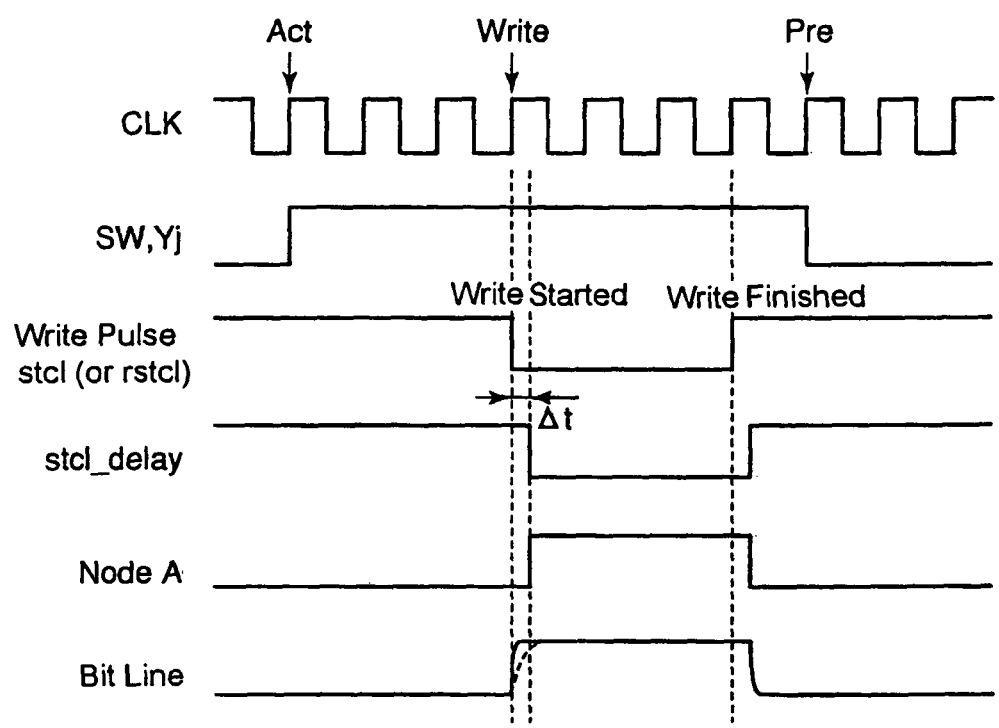
FIG. 5 is a time chart for explaining the operation of the phase change memory device of FIG. 4.

Hereinbelow, referring also to FIG. 5, the operation of the phase change memory device of FIG. 4 will be described.

When a word line drive signal (SW) and a Yj selection signal (Yj) are changed to an active level at timing Act, cell transistors 112 and a Yj switch 13 are both turned on.

Then, when a Write pulse (SET signal stcl or RESET signal rstcl) is changed to an inactive level at timing Write, the PMOS 411 (or 414) serving as a switch is turned on so that the bit line 12 is driven.

In this event, the delay circuit 4131 (or 4161) supplies a delay Write pulse, obtained by delaying the Write pulse by a fixed time Δt, to the gates of the PMOS 4132 and the NMOS 4133 (or the PMOS 4162 and the NMOS 4163). Accordingly, the PMOS 4132 (or 4162) remains off and the NMOS 4133 (or 4163) remains on until the lapse of Δt from a time point when the Write pulse is changed to the inactive level. In this manner, the PMOS 4132 and the NMOS 4133 (or the PMOS 4162 and the NMOS 4163) serve as a switching portion. As a result, a low-potential side voltage VSS is applied to the gate of the PMOS 412 (or 415). In this manner, the voltage VSS lower than the constant voltage VWEREF1 (or VWEREF2) is applied to the gate of the PMOS 412 (or 415) serving as a current trimming portion. Consequently, the on-state resistance of the PMOS 412 (or 415) is reduced so that the current supplied to the bit line 12 becomes large. That is, the bit line 12 is driven with a relatively high first current driving capability. As a result, the voltage rise of the bit line 12 becomes steep (high speed). FIG. 5 shows, in broken line, a change in bit line voltage when the constant voltage VWEREF1 (or VWEREF2) is applied to the gate of the PMOS 412 (or 415).

After the lapse of the fixed time Δt, the delay Write pulse is changed to an inactive level so that the PMOS 4132 (or 4162) is turned on and the NMOS 4133 (or 4163) is turned off. Thus, the constant voltage VWEREF1 (or VWEREF2) is applied to the gate of the PMOS 412 (or 415) so that the amount of current supplied to the bit line 12 is limited to a predetermined value or less. As a result, the bit line 12 is driven with a second current driving capability lower than the first current driving capability. The driving of the bit line 12 with the second current driving capability is carried out until the voltage of the bit line 12 reaches a voltage corresponding to data to be written, and is further continued thereafter.

As described above, in this embodiment, the control voltage changing sections 413 and 416 each serve as current driving capability changing section for changing the current driving capability of the write amplifier 41 by changing the gate voltage (control voltage) of the current trimming PMOS 412 or 415.

In the phase change memory device according to this embodiment, by changing the control voltage of the current trimming PMOS 412 or 415 to change the current limit value (current driving capability), it is possible to drive the bit line with the first current driving capability higher than the second current driving capability immediately after the start of driving the bit line and to drive the bit line with the second current driving capability lower than the first current driving capability after the lapse of the fixed time. This makes it possible to shorten the write time and to prevent an increase in power consumption and the occurrence of a write error.

It is apparent that the present invention is not limited to the above embodiments, but may be modified and changed without departing from the scope and spirit of the invention.

For example, the drains of the NMOSs 4133 and 4163 are each connected to the low-potential side power supply VSS in the phase change memory device of FIG. 4, but a lower voltage (negative voltage) may be applied thereto to further enhance the current driving capability.

What is claimed is:

1. A semiconductor device comprising a write amplifier adapted to drive a bit line, connected to a selected phase change memory cell, with a first current driving capability and then to drive said bit line to a write voltage, corresponding to data to be written, with a second current driving capability lower than said first current driving capability, wherein said write amplifier comprises a first write amplifier section and a second write amplifier section, said first write amplifier section and said second write amplifier section jointly provide said first current driving capability, said second write amplifier section provides said second current driving capability, said first write amplifier section comprises a first switch and a first current trimming portion connected in series between a high-potential side power supply and said bit line, said first switch adapted to be turned on or off in response to an input signal and said first current trimming portion adapted to limit a passing current depending on a voltage of said bit line, and said second write amplifier section comprises a second switch and a second current trimming portion connected in series between said bit line and said high-potential side power supply, said second switch adapted to be turned on or off in response to said input signal and said second current trimming portion adapted to limit a passing current to realize said second current driving capability.

2. A semiconductor device comprising a write amplifier adapted to drive a bit line, connected to a selected phase change memory cell, with a first current driving capability and then to drive said bit line to a write voltage, corresponding to data to be written, with a second current driving capability lower than said first current driving capability, wherein said write amplifier comprises a write amplifier section adapted to drive, in response to an input signal, said bit line with a current driving capability according to a control voltage and a control voltage changing section adapted to change said control voltage, and said control voltage changing section changes said control voltage based on a delay signal obtained by delaying said input signal, thereby changing the current driving capability of said write amplifier section from said first current driving capability to said second current driving capability.

3. The device according to claim 2, wherein said write amplifier section comprises a switch and a current trimming portion connected in series between said bit line and a high-potential side power supply, said switch adapted to be turned on or off in response to said input signal and said current trimming portion adapted to limit a passing current depending on said control voltage, and said control voltage changing section comprises a delay circuit adapted to delay said input signal and a switching portion adapted to switch said control voltage in response to said delay signal from said delay circuit.

4. A semiconductor device comprising at least one memory cell, a bit line operatively coupled to the memory cell, and a write amplifier writing data into the memory cell by driving the bit line, the write amplifier being configured to drive the bit line with a first driving capability and with a second driving capability that is changed, in response to a potential change of the bit line, from the first driving capability without suspending driving the bit line to allow a writing current to continue flowing through the memory cell during a transition from the first driving capability to the second driving capability, wherein the second driving capability is lower than said first current driving capability, wherein the write amplifier comprises a first amplifier and a second write amplifier section, both of the first amplifier and second write amplifier section being activated to provide the first driving capability, and at least one of the first amplifier and the second write amplifier section being deactivated to provide the second driving capability, wherein the first amplifier comprises a first switch and a first current trimming portion connected in series between a high-potential side power supply and the bit line, the first switch adapted to be turned on or off in response to an input signal and the first current trimming portion adapted to limit a passing current depending on a voltage of the bit line.

5. The device according to claim 4, wherein the memory cell comprises a phase change memory cell.

6. The device according to claim 4, wherein the second write amplifier section comprises a second switch and a second current trimming portion connected in series between the bit line and the high-potential side power supply, the second switch adapted to be turned on or off in response to the input signal and the second current trimming portion adapted to limit a passing current to realize the second driving capability.

7. A semiconductor device comprising at least one memory cell, a bit line operatively coupled to the memory cell, and a write amplifier writing data into the memory cell by driving the bit line, the write amplifier being configured to drive the bit line with a first driving capability and with a second driving capability that is changed, in response to a potential change of the bit line, from the first driving capability without suspending driving the bit line to allow a writing current to continue flowing through the memory cell during a transition from the first driving capability to the second driving capability, wherein the write amplifier comprises a write amplifier section adapted to drive, in response to an input signal, the bit line with a driving capability according to a control voltage and a control voltage changing section adapted to change the control voltage, wherein the control voltage changing section changes the control voltage based on a delay signal obtained by delaying the input signal, thereby changing the driving capability of the write amplifier section from the first driving capability to the second driving capability.

8. The device according to claim 7, wherein the second driving capability is lower than the first driving capability.

9. The device according to claim 8, wherein the write amplifier section comprises a switch and a current trimming portion connected in series between the bit line and a high-potential side power supply, the switch adapted to be turned on or off in response to the input signal and the current trimming portion adapted to limit a passing current depending on the control voltage.

10. The device according to claim 9, wherein the control voltage changing section comprises a delay circuit adapted to delay the input signal and a switching portion adapted to switch the control voltage in response to a delay signal from the delay circuit.

11. The device according to claim 7, wherein the write amplifier section comprises a switch and a current trimming portion connected in series between the bit line and a high-potential side power supply, the switch adapted to be turned on or off in response to the input signal and the current trimming portion adapted to limit a passing current depending on the control voltage.

12. The device according to claim 11, wherein the control voltage changing section comprises a delay circuit adapted to delay the input signal and a switching portion adapted to switch the control voltage in response to a delay signal from the delay circuit.

13. The device according to claim 12, wherein the second driving capability is lower than the first driving capability.

* * * * *